US009910070B2

United States Patent
Cheng et al.

(10) Patent No.: US 9,910,070 B2
(45) Date of Patent: Mar. 6, 2018

(54) COMPENSATING APPARATUS FOR A NON-CONTACT CURRENT SENSOR INSTALLING VARIATION IN TWO WIRE POWER CABLE

(71) Applicant: Industrial Technology Research Institute, Hsin-Chu (TW)

(72) Inventors: Shih-Hsien Cheng, Kaohsiung (TW); Pei-Fang Liang, Hsinchu County (TW); Lien-Yi Cho, Miaoli County (TW); Wei-Hung Hsu, Taipei (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 1105 days.

(21) Appl. No.: 14/138,353

(22) Filed: Dec. 23, 2013

(65) Prior Publication Data

US 2015/0177355 A1 Jun. 25, 2015

(30) Foreign Application Priority Data

Dec. 20, 2013 (TW) .............................. 102147533 A

(51) Int. Cl.
*G01R 15/14* (2006.01)
*G01R 35/00* (2006.01)

(52) U.S. Cl.
CPC .......... *G01R 15/142* (2013.01); *G01R 35/005* (2013.01)

(58) Field of Classification Search
CPC . G01V 3/12; G01R 1/22; G01R 15/20; G01R 33/02
(Continued)

(56) References Cited

U.S. PATENT DOCUMENTS 6,184,672 B1  2/2001  Berkcan
7,164,263 B2  1/2007  Yakymyshyn et al.
(Continued)

FOREIGN PATENT DOCUMENTS

CN       1353818 A   6/2002
CN    101529259 A   9/2009
(Continued)

OTHER PUBLICATIONS

Eli S. Leland,"Energy scavenging power sources for household electrical monitoring" , 2006, pp. 165-168.*
(Continued)

*Primary Examiner* — Andrew Schechter
*Assistant Examiner* — Kaleria Knox
(74) *Attorney, Agent, or Firm* — WPAT, PC

(57) ABSTRACT

A compensating apparatus for installing variation of a non-contact current sensor on a two-wire power cable includes a non-contact current sensor, a sensing element characteristic measuring unit and a non-contact current measurement module. The non-contact current sensor mounted top to the two-wire power cable further has a first current sensor, a second current sensor, and a third current sensor. The sensing element characteristic measuring unit is to construct a space characteristic measuring database for the non-contact current sensor respective to the two-wire power cable. The non-contact current measurement module is to pair the space characteristic measuring database so as to compute and further output a measured value of the current I in the two-wire power cable.

5 Claims, 9 Drawing Sheets

(58) Field of Classification Search
USPC .............. 324/332, 252, 117 R; 702/104
See application file for complete search history.

(56) References Cited

U.S. PATENT DOCUMENTS

| | | | |
|---|---|---|---|
| 7,298,133 | B2 | 11/2007 | Hastings et al. |
| 7,564,233 | B2* | 7/2009 | Kojovic ............... G01R 15/181 |
| | | | 324/117 R |
| 8,508,212 | B2 | 8/2013 | El-Essawy et al. |
| 2010/0141237 | A1 | 6/2010 | Dietz et al. |
| 2010/0315095 | A1 | 12/2010 | Younsi et al. |
| 2011/0210741 | A1* | 9/2011 | Sudow .................... G01V 3/12 |
| | | | 324/332 |
| 2012/0187945 | A1 | 7/2012 | Ogimoto |
| 2012/0200291 | A1* | 8/2012 | Carpenter ................ G01R 1/22 |
| | | | 324/252 |
| 2012/0319676 | A1 | 12/2012 | El-Essawy et al. |
| 2013/0076343 | A1 | 3/2013 | Carpenter et al. |
| 2013/0090869 | A1 | 4/2013 | Ewing et al. |
| 2013/0099775 | A1 | 4/2013 | Mitsuya |

FOREIGN PATENT DOCUMENTS

| | | |
|---|---|---|
| CN | 102012446 A | 4/2011 |
| CN | 102062807 A | 5/2011 |
| CN | 102132167 A | 7/2011 |
| CN | 102411079 A | 4/2012 |
| CN | 102812366 A | 12/2012 |
| CN | 103645369 | 3/2014 |
| JP | 2005-91021 A | 4/2005 |
| TW | 200533928 | 10/2005 |
| TW | 201120458 | 6/2011 |
| TW | 201215898 A | 4/2012 |
| TW | 201241442 | 10/2012 |
| TW | 201319605 A | 5/2013 |
| TW | 201331593 A1 | 8/2013 |

OTHER PUBLICATIONS

Unique EHV current probe for calibration and monitoring Andersson, A. et al. Transmission and Distribution Conference and Exposition, 2001 IEEE/PES 2001 379-384.
A Coreless Electric Current Sensor With Circular Conductor Positioning Calibration Chan, J.Y.C. et al. Instrumentation and Measurement, IEEE Transactions 2013 P1.
Processing magnetic sensor array data for AC current measurement in multiconductor systems D'Antona, G. et al. Instrumentation and Measurement, IEEE Transactions 2001 1289-1295.
Stick-On Piezoelectromagnetic AC Current Monitoring of Circuit Breaker Panels Xu, Q.R. et al. Sensors Journal, IEEE 2013 1055-1064.
Development of a portable fiber-optic current sensor for power systems monitoring Mikhailovic, P. et al. Instrumentation and Measurement, IEEE Transactions 2004 24-30.
Taiwan Patent Office, "Office Action", dated Feb. 3, 2015.
State Intellectual Property Office of the People's Republic of China, "Office Action", dated Feb. 24, 2017.
State Intellectual Property Office of the People's Republic of China, "Notice of Allowance", dated Jun. 21, 2017.

* cited by examiner

COMPENSATING APPARATUS FOR A NON-CONTACT CURRENT SENSOR INSTALLING VARIATION IN TWO WIRE POWER CABLE

CROSS REFERENCE TO RELATED APPLICATION

The present application is based on, and claims priority from, Taiwan (International) Application Serial No. 102147533, filed on Dec. 20, 2013, the disclosure of which is hereby incorporated by reference herein in its entirety.

TECHNICAL FIELD

The present disclosure relates to a current sensor, and more particularly to a compensating apparatus for installing variation of a non-contact current sensor on a two-wire power cable.

BACKGROUND

With rapid advance in automation industry, demands of high-reliability and high-performance upon the control instruments are significantly rising. Various sensors are widely used for the purpose of automatic and persistent monitoring. In particular, the current sensor plays one of crucial roles for the panel detection and control in both the industrial and the domestic applications.

Currently, the current sensors in the art can be theoretically classified into four categories: 1. the shunt resistor according to the Ohm's law, 2. the current transformer according to the Faraday's law of induction 3. The Hall element according to the magnetic detection, and 4. the fiber optic current sensor according to the Faraday effect. The former two types are criticized for their mass heat generation due to direct measuring and for irrelevance to the multi-core power cable due to their cumbersome volumes. On the other hand, the Hall element that is tiny in volume and can function without direct contacting would be superior to the former two types of the current sensors. However, before adopting the Hall elements to the multi-core power cables, the distance between the Hall element and the power cable to be detected is critical. In addition, the fiber optic current sensor is low in sensitivity, difficult in maintenance, and complicated in structuring, and thus its application is pretty limited.

According to the Amp principle, when an electric current flows through a conductive object, a surrounding magnetic field would be induced. The magnitude of the induced magnetic field is proportional to the current in the conductive object, but is inversely proportional to the spacing in between. Through the knowledge of the induced magnetic field, the current through the conductive object can be realized. However, all the aforesaid or not said non-contact current sensors in the art have a common shortcoming of measurement bias due to inappropriate mounting positions. Therefore, it is definite that an improvement upon the non-contact current sensors for compensating the position-induced measurement bias is urgent and welcome to the skill in the art.

SUMMARY

The present disclosure is to provide a compensating apparatus for installing variation of a non-contact current sensor on a two-wire power cable so as thereby to amend the unstable measurement bias (sometimes, over hundred percentages of errors) due to the ill-mounting position of the non-contact current sensor, and so as to have the consumer product to achieve a stable quality while meeting various situations in mounting the non-contact current sensor. Through a suitable pair of the measurement devices and the calculation algorithms, the compensating apparatus for installing variation of a non-contact current sensor on a two-wire power cable can estimate the human factor and the manufacturing variation so as to reduce the measurement bias and further to achieve the object of automatic measurement.

According to the Ampere's circuital law, as an electric current flows through a longitudinal lead, a circular magnetic field will be induced around the lead. The circular magnetic field is proportional to the electric current, and can be exactly computed as the equation of $$B_r = \frac{\mu_0 I}{2\pi r},$$

in which the $\mu_0$ is the permeability, the $I$ is the electric current, and the $B^r$ is the magnetic flux density at a place having a distance $r$ to the center of the lead. Further, according to the Faraday principle, the induced voltage of the coil can be computed as $$V = N \cdot A \frac{dB}{dt} = N \frac{d\phi}{dt},$$

in which the $N$ is the number of the coil of the lead, the $A$ is the area circulated by the coil, and the $\phi$ is the effective flux. By given the coil number $N$ and the coil area $A$, the current to be detected $I$ at a detecting point $r$ is proportional to the induced voltage $V$. Hence, in order to compute the current to be detected $I$ from the induced voltage $V$, the detecting point $r$, the coil number $N$ and the coil area $A$ need to be known in advance, in which the coil number $N$ and the coil area $A$ are fixed parameters and won't vary with the detecting position. However, the detecting point $r$ is changed with the mounting position, and so the detecting point $r$ needs to be real-timely obtained if an immediate measurement is requested. In an orthogonal coordinate system, the $r$ of the lead is related to the first distance $g_1$ of the vertical displacement and the horizontal displacement $W$. Namely, if the induced voltage $V$ is used to derive the current to be detected $I$, the first distance $g_1$ of the vertical displacement and the horizontal displacement $W$ need to be measured in advance, in which the first distance $g_1$ of the vertical displacement is the distance between the detecting point and the lead, and the horizontal displacement $W$ is the horizontal distance perpendicular to the vertical displacement.

In this disclosure, the compensating apparatus for installing variation of a non-contact current sensor on a two-wire power cable introduces a coupling algorithms to derive the current to be detected $I$ in the two-wire power cable, the first distance $g_1$ of the vertical displacement and the horizontal displacement $W$ between the non-contact current sensor and the two-wire power cable.

Computation of the first distance $g_1$ of the vertical displacement: Apply two identical magnetic sensors spaced fixedly by a fixed distance $g_2$ along the detection direction of the measurement. The magnetic flux densities at the two magnetic sensors are $$B_r = \frac{\mu_0 I}{2\pi(g_1)} \text{ and } B_{r+g} = \frac{\mu_0 I}{2\pi(g_1+g_2)},$$

respectively. The output signals of the two magnetic sensors are related to the current to be detected I and the first distance $g_1$ of the vertical displacement. By given all the other parameters of involved elements, the simultaneous equations for the outputs signals of the two magnetic sensors can be used to derive the current to be detected I and the first distance $g_1$ of the vertical displacement.

Computation of the horizontal displacement W: Apply two identical magnetic sensors arranged parallel and symmetrically with respect to the main measured element, and integrate in series the two signals of the two magnetic sensors. The symmetrical structure of the two-wire power cable would make the in-serial output signals to be proportional to the horizontal displacement W between the sensors along the central axis of the power cable. By given all the required parameters of then involved elements and the current to be detected I, the first distance $g_1$ of the vertical displacement can be computed, and then the horizontal displacement W between the sensors along the central axis of the power cable can be derived. Through 2D (vertical and horizontal) coupling computations, accurate values of the first distance $g_1$ of the vertical displacement of the sensors, the horizontal displacement W of the sensors and the current to be detected I can be better approached. Therefore, the current I to be detected can be obtained whatever the mounting position of the non-contact current sensor is.

According to the Ampere's circuital law, a circular magnetic field around a longitudinal lead would be induced if the electric current flows through the lead. The circular magnetic field is proportional to the electric current in the lead, and can be obtained by the equation of $$B_r = \frac{\mu_0 I}{2\pi r},$$

in which the $\mu_0$ is the magnetic permeability, the I is the electric current in the lead, and the $B_r$ is the magnetic flux density at the radius r of the lead. By having planar-coiled current sensors to detect the electric current in the lead as shown in FIG. 1 and FIG. 2, according to the Faraday's lay of induction, the output voltage can be computed by the equation of $$\text{emf}(v) = -\frac{d\phi}{dt} = -N \cdot A \cdot \frac{dB_r}{dt},$$

and the output voltage for the planar-coiled current sensor is $$\text{emf}(v) = -\sum_{n=1}^{N} \frac{d\Phi_n}{dt} = \frac{\omega\mu_0 I \sin\omega t}{2\pi} \sum_{n=1}^{N} c_n \ln\left(\frac{b_n^2 + g_1^2}{a_n^2 + g_1^2}\right),$$

in which $$\Phi_n = \int \vec{B} \cdot d\vec{A} = \frac{\mu_0 I \cos\omega t}{\pi} c_n \int_{a_n}^{b_n} \frac{x}{x^2 + g_1^2} dx$$

$$a_n = \frac{d}{2} - \frac{1}{2}[w_c - 2n \cdot w_d - 2(n-1) \cdot w_s]$$

$$b_n = \frac{d}{2} + \frac{1}{2}[w_c - 2n \cdot w_d - 2(n-1) \cdot w_s]$$

$$c_n = L - 2n \cdot w_d - 2(n-1) \cdot w_s.$$

As shown in FIG. 2, the $w_s$, $w_c$, and $w_d$ are defined for some important distances related to the planar-coiled current sensors. In FIG. 2, the electric current I penetrates perpendicularly out of the paper at x=0, while the electric current I penetrates perpendicularly into the paper at x=d. As shown in FIG. 1, the first distance $g_1$ is the shortest distance between the coil of the first current sensor and the two-wire power cable, and the second distance $g_2$ is the shortest distance between the coil of the first current sensor and the coil of the second current sensor. For the position relationship between the first current sensor and the second current sensor is preset and not a variable, so the second distance $g_2$ is a fixed value. In the computation setup, while neglecting the horizontal displacement, the current to be detected I and the first distance $g_1$ of the two-wire power cable are unknown, the corresponding distances $w_s$, $w_c$, and $w_d$ for the planar-coiled current sensors are given, and the meaningful geometric parameters $a_n$, $b_n$, $c_n$, and N are also fixed and given. Hence, two simultaneous equations are needed to compute the current to be detected I and the first distance $g_1$. On the other hand, while neglecting the vertical displacement, $a_n$ and $b_n$ would vary proportionally with the horizontal displacement W, and hence one more equation is needed to calculate the variation. The non-contact current sensor in this disclosure, as the design shown in FIG. 3A, is to utilize three current-detecting coils to formulate three independent simultaneous equations for calculating the first distance $g_1$ (vertical), the horizontal displacement W and the current to be detected I so as thereby to compensate the installing variation. These three independent simultaneous equations are listed as follows.

$$\begin{cases} V_1 = \frac{\omega\mu_0 I \sin\omega t}{2\pi} \sum_{n=1}^{N} c_n \ln\left(\frac{b_n^2 + g_1^2}{a_n^2 + g_1^2}\right) \\ V_2 = \frac{\omega\mu_0 I \sin\omega t}{2\pi} \sum_{n=1}^{N} c_n \ln\left(\frac{b_n^2 + (g_1+g_2)^2}{a_n^2 + (g_1+g_2)^2}\right) \\ V_3 = \frac{\omega\mu_0 I \sin\omega t}{2\pi} \sum_{n=1}^{N} c_n \ln\left(\frac{b_n'^2 + g_1^2}{a_n'^2 + g_1^2}\right) \end{cases};$$

The first step of the coupling compensation method in this disclosure is to utilize the built-in equations involving the first distance $g_1$ and the $$\frac{V_1}{V_2}$$

ratio to compute the first distance $g_1$, in which the first voltage $V_1$ is the detected voltage difference between the input end and the output end of the first current sensor, and the second voltage $V_2$ is the detected voltage difference between the input end and the output end of the second current sensor. Through the ratio $$\frac{V_1}{V_2},$$

a corresponding first function $f_1$ is formed as follows.

$$g_1 = f_1\left(\frac{V_1}{V_2}, W\right) \ldots \text{the first function } f_1.$$

It is noted that the first function $f_1$ relates the horizontal displacement W, the first distance $g_1$ and the $$\frac{V_1}{V_2}.$$

As the first voltage $V_1$ and the second voltage $V_2$ are detected and the horizontal displacement W is given, the first step of the coupling compensation method can apply the first function $f_1$ to derive a corresponding first distance $g_1$.

The second step of the coupling compensation method in this disclosure is to utilize the built-in equations involving the current to be detected I and the $$\frac{V_1}{V_2}$$

ratio so as further to compute the gain, or say the current-calibrating factor $$\frac{I}{V_1},$$

according to the second function $f_2$ as follows.

$$\frac{I}{V_1} = \text{gain} = f_2\left(\frac{V_1}{V_2}, W\right) \ldots \text{the second function } f_2.$$

It is noted that the second function $f_2$ relates the horizontal displacement W, the gain $$\frac{1}{V_1}$$

and the $$\frac{V_1}{V_2}.$$

As the first voltage $V_1$ and the second voltage $V_2$ are detected and the horizontal displacement W is given, the second step of the coupling compensation method can apply the first function $f_2$ to derive a corresponding current to be detected I of the two-wire power cable.

The third step of the coupling compensation method in this disclosure is to utilize the built-in equations involving the horizontal displacement W and the third voltage $V_3$ so as further to compute the horizontal displacement W according to the second function $f_3$ as follows.

$$W = f_3\left(g_1, \frac{V_3}{I}\right) \ldots \text{the third function } f_3.$$

It is noted that the third function $f_2$ relates the horizontal displacement W, the first distance $g_1$ and the $$\frac{V_3}{I},$$

in which the third voltage $V_3$ is the detected voltage difference between the input end and the output end of the third current sensor, and the I is the current to be detected obtained from the aforesaid second function $f_2$. As the third voltage $V_3$ and the current to be detected are detected and the first distance $g_1$ is given, the third step of the coupling compensation method can apply the third function $f_3$ to derive a corresponding horizontal displacement W.

Finally, the fourth step of the coupling compensation in this disclosure is firstly to set up the initial conditions of the first distance $g_1$=0 the current I to be detected=5 A. and the horizontal displacement W=0 mm. Then, the coupling computation is performed by executing orderly the first step, the second step and the third step and is ended till the current I to be detected is convergent as $$\frac{(I_n - I_{n-1})}{I_n} < 0.01,$$

or the number of the coupling computation exceeds 20 times. While the coupling computation is not convergent, then re-setup of the initial conditions is introduced.

Further, from FIG. 3A and FIG. 4, it is noted that the third current sensor is consisted, in serial, of two independent coil loops lying along the horizontal direction and located symmetrically to the center line of the non-contact current sensor. The voltage difference detected between the input end and the output end of the third current sensor is defined as a third voltage $V_3$. The horizontal displacement W of the center axis of the two-wire power cable and the third current sensor is a 1-1 function, as a shown in FIG. 3A. In the coils of the third current sensor, the voltage difference measured between the input end and the output end of the third current sensor is the third voltage $V_3$. Finally the whole algorithms can be assorted to: (1) obtain the vertical first distance $g_1$ and the current I to be detected from the vertical simultaneous equations, and (2) obtain the horizontal displacement of the center axis of the two-wire power cable to the non-contact current sensor from the aforesaid vertical first distance $g_1$ and current I to be detected. Upon such a coupling arrangement, the vertical first distance $g_1$ of the sensor, the horizontal displacement W of the sensor, and the current to be detected I can be accurately approached.

In one embodiment of this disclosure, the compensating apparatus for installing variation of a non-contact current sensor on a two-wire power cable comprises a non-contact current sensor, a sensing element characteristic measuring unit, and a non-contact current measurement module, in which the non-contact current sensor can further include a first current sensor, a second current sensor, and a third current sensor. The non-contact current sensor located at a top position of the two-wire power cable is to measure the space magnetic field variation caused by the current variation in the two-wire power cable. Namely, the horizontal direction is defined as the direction along the line connecting the two centers of the inner diameters of the two power wires of the two-wire power cable, and the vertical direction is the direction perpendicular to the horizontal direction. The sensing element characteristic measuring unit is to construct the space characteristic measuring database of the two-wire power cable with respect to the non-contact current sensor. The non-contact current measurement module is to output a measured value of the current I of the two-wire power cable.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
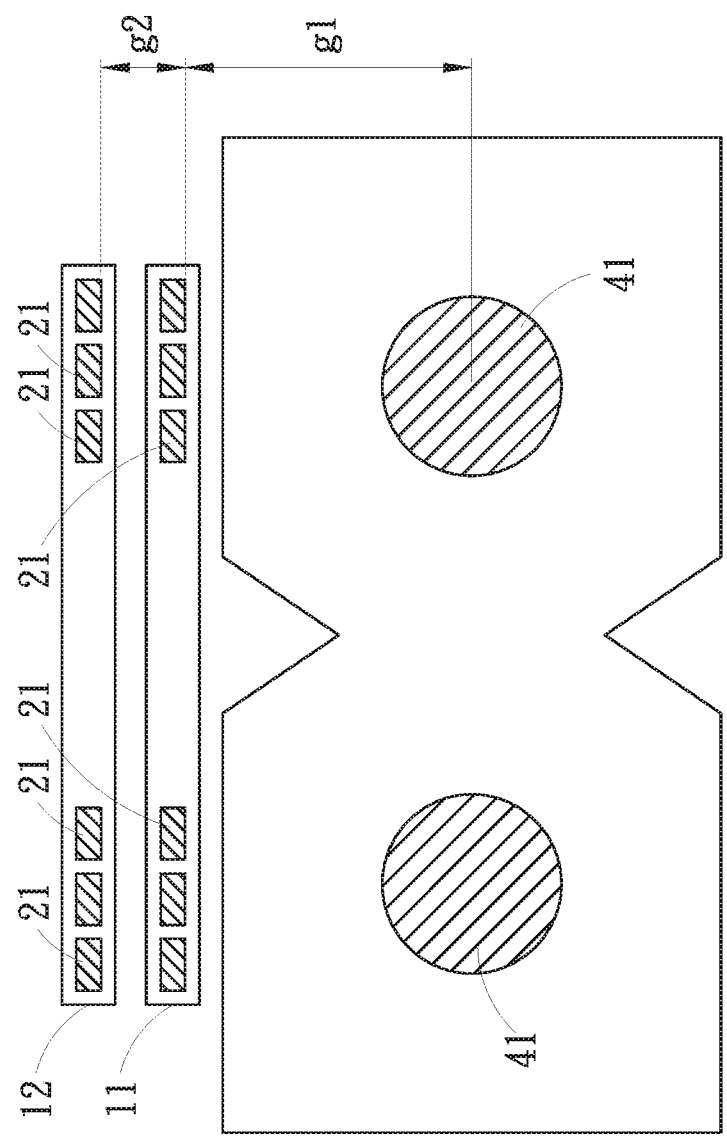
FIG. 1 is a schematic view of the first current sensors, the second current sensors and the two-wire power cable of this disclosure.
Figure 2:
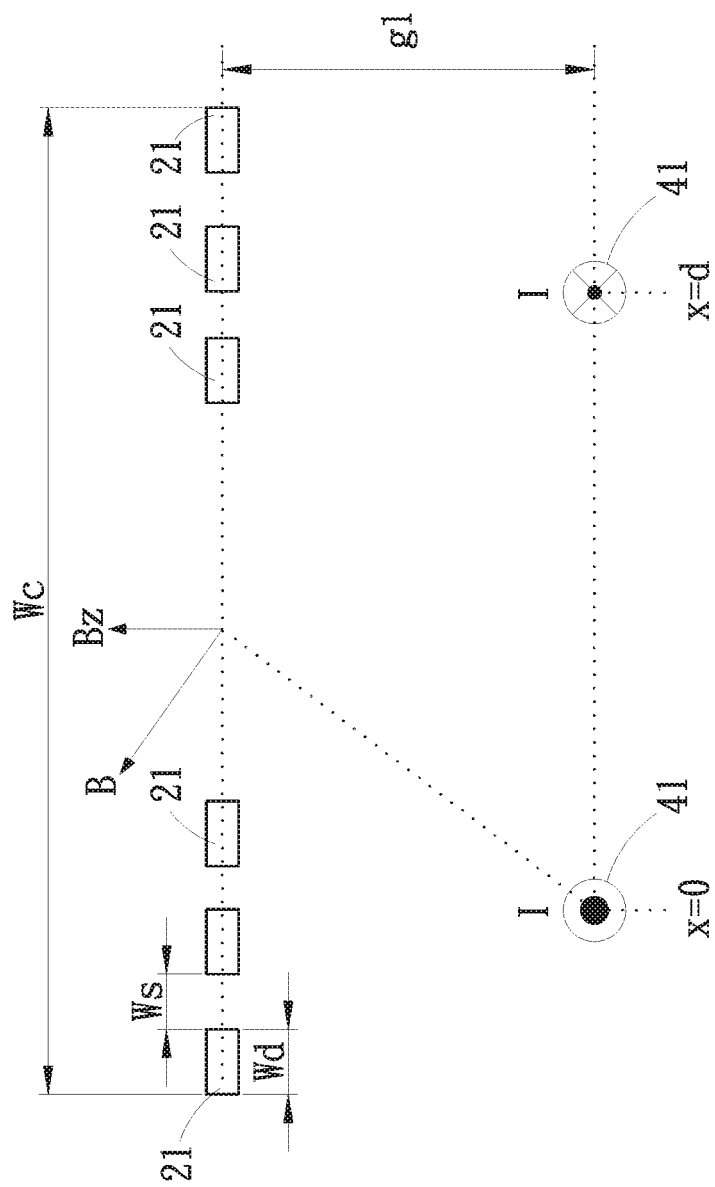
FIG. 2 shows an environment of this disclosure to perform the Faraday's law of induction upon the second current sensors and the two-wire power cable.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referred to FIG. 3A, FIG. 3B, FIG. 3C and FIG. 8, in one embodiment of this disclosure, the compensating apparatus for installing variation of a non-contact current sensor 10 is applied to detect the electric current of a two-wire power cable 41 and includes a non-contact current sensor 10, a sensing element characteristic measuring unit 50, and a non-contact current measurement module 60. The non-contact current sensor 10 further includes a first current sensor 11, a second current sensor 12, and a third current sensor 13. The non-contact current sensor 10 is mounted at a top position of the two-wire power cable 41. The two-wire power cable 41 has two power wires having individual centers of the respective inner diameters, in which the connection line of the centers are extended along a horizontal direction. The direction that is perpendicular to the horizontal direction is defined as a vertical direction. The sensing element characteristic measuring unit 50 is to construct a space characteristic measuring database 51 of the non-contact current sensor 10 with respect to the two-wire power cable 41. The non-contact current measurement module 60 is to pair the built-in space characteristic measuring database 51 and so as thereby to calculate and output a measured value of the current I of the two-wire power cable 41.

Figure 3A:
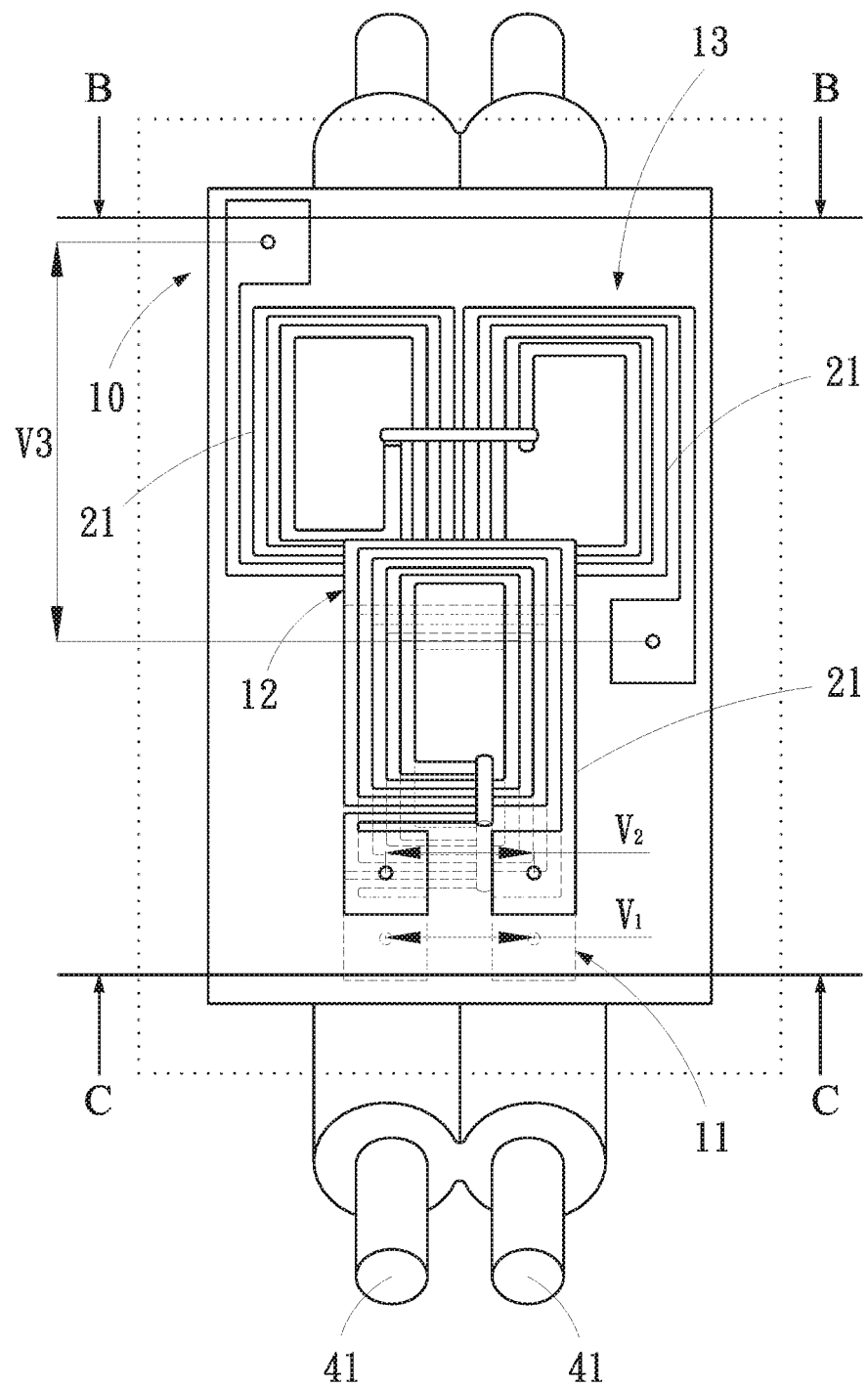
FIG. 3A is a top view of the non-contact current sensor.
Figure 3B:
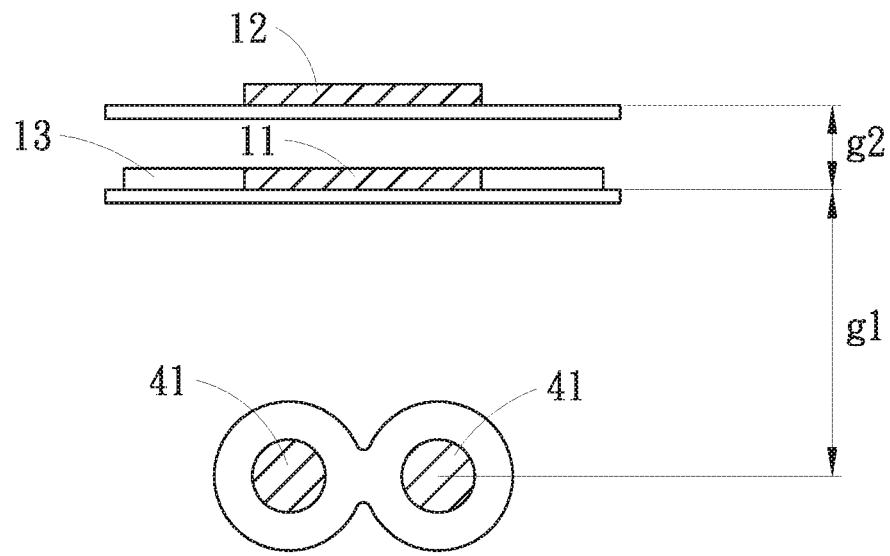
FIG. 3B is a side view of FIG. 3A, viewing from C to B.
Figure 3C:
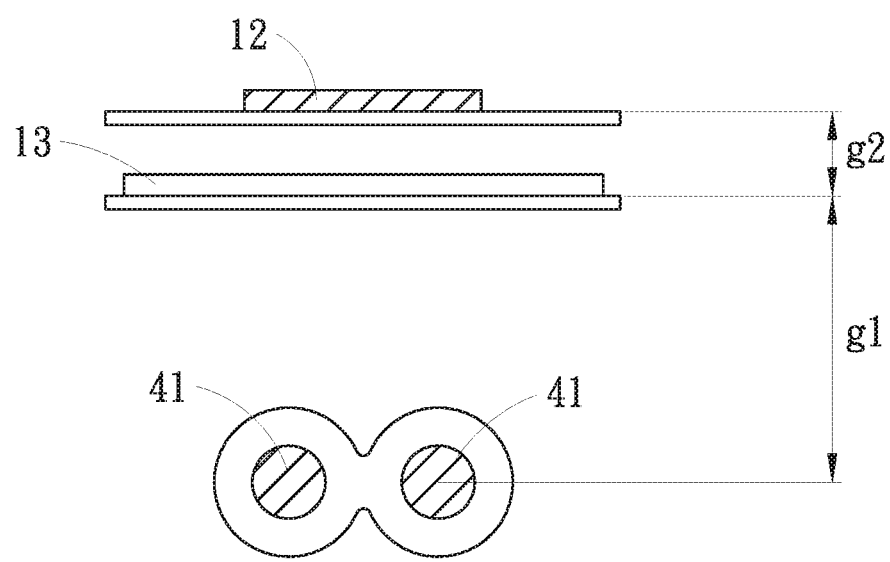
FIG. 3C is another side view of FIG. 3A, viewing from B to C.

Refer now FIG. 3A, FIG. 3B, FIG. 3C, in which FIG. 3A is a top view of the non-contact current sensor 10, FIG. 3B is a side view of FIG. 3A at a viewing angle from C to B, and FIG. 3C is another side view of FIG. 3A at a viewing angle from B to C. As shown, the non-contact current sensor 10 includes the second current sensor 12, the first current sensor 11, and the third current sensor 13. The first current sensor 11 is located vertically above the two-wire power cable 41, and is spaced from the centers of the two-wire power cable 41 by a first distance $g_1$. The second current sensor 12 is located further vertically above the first current sensor 11, and is spaced from the first current sensor 11 by a second distance $g_2$. The third current sensor 13 lying horizontally with respect to the two-wire power cable 41 is formed by two independent coils 21 connected in series and located symmetrically to the center line of the non-contact current sensor 10. The voltage difference measured between an input end and an output end of the third current sensor 13 is defined as a third voltage $V_3$. In this embodiment, the first current sensor 11 and the second current sensor 12 are both coil-formed loops, the voltage difference measured between the input end and the output end of the first current sensor 11 is defined as a first voltage $V_1$, and the voltage difference measured between the input end and the output end of the second current sensor 12 is defined as a second voltage $V_2$.

Figure 4:
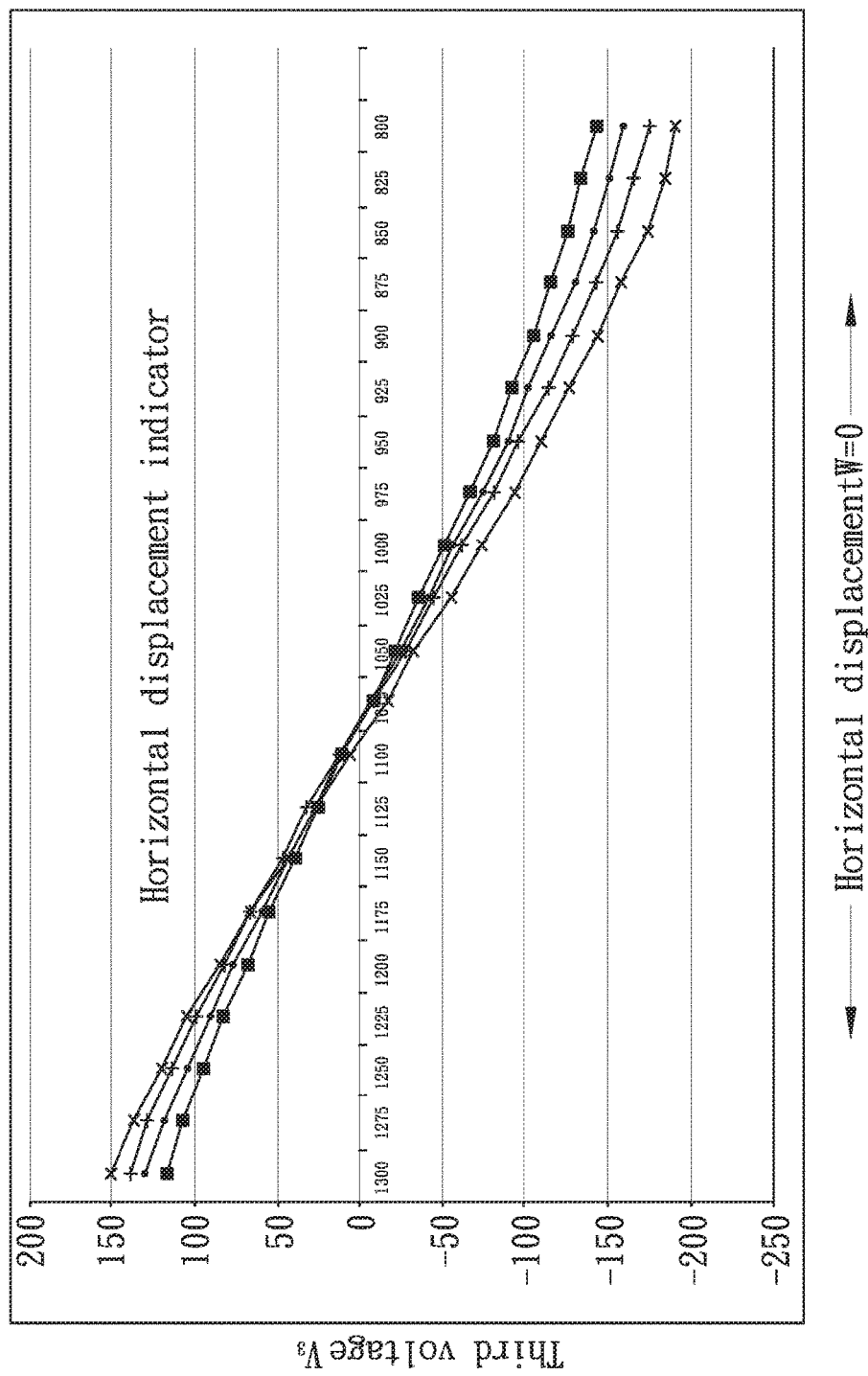
FIG. 4 shows the normalized horizontal displacement indicators for various pairs of the horizontal displacements W and the third voltages $V_3$.
Figure 5:
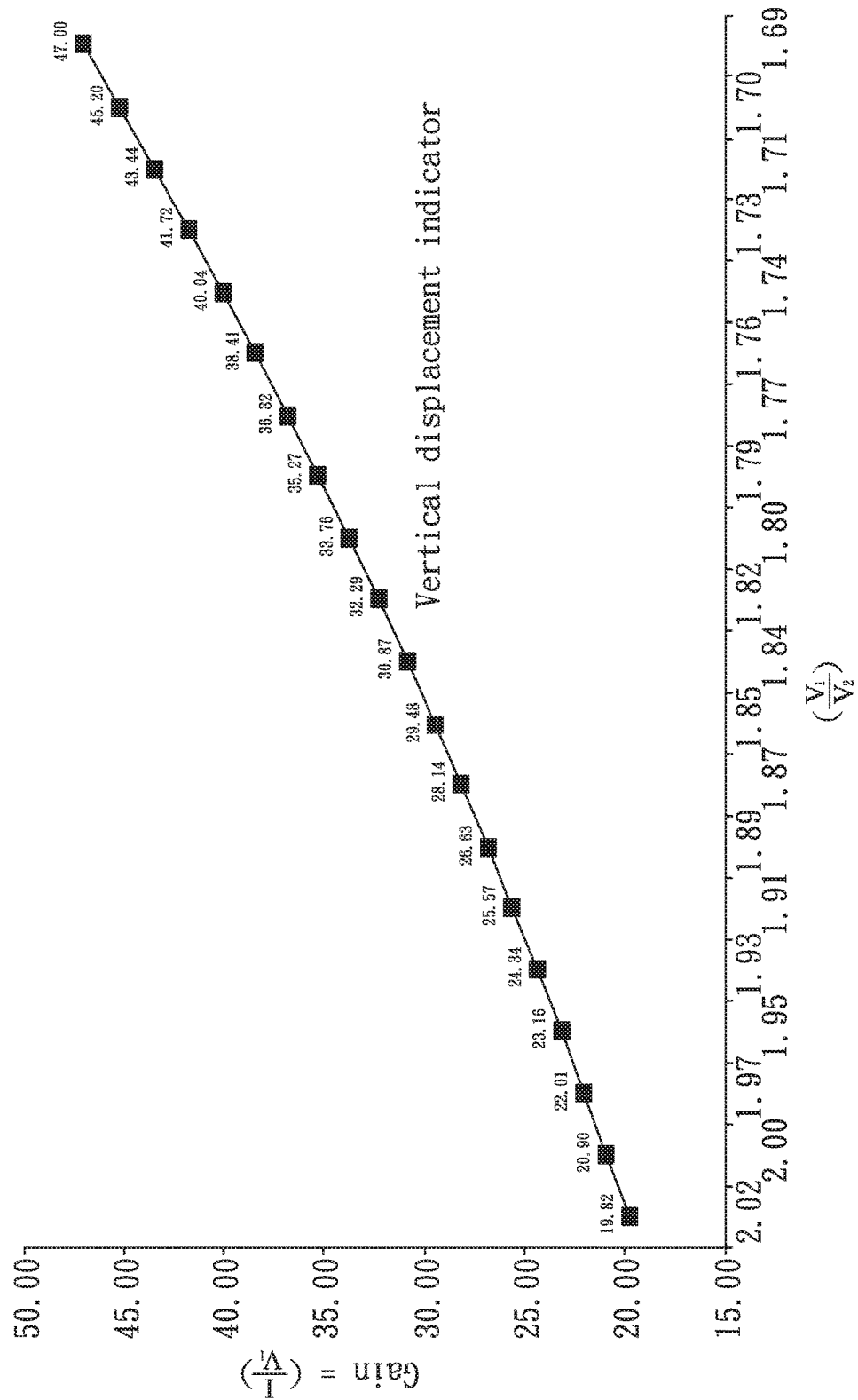
FIG. 5 shows the vertical displacement indicator for various pairs of the [first voltage $V_1$/the second voltage $V_2$] and the $$\text{gain} = \left[\frac{I}{V_1}\right] V_3;$$
Figure 6:
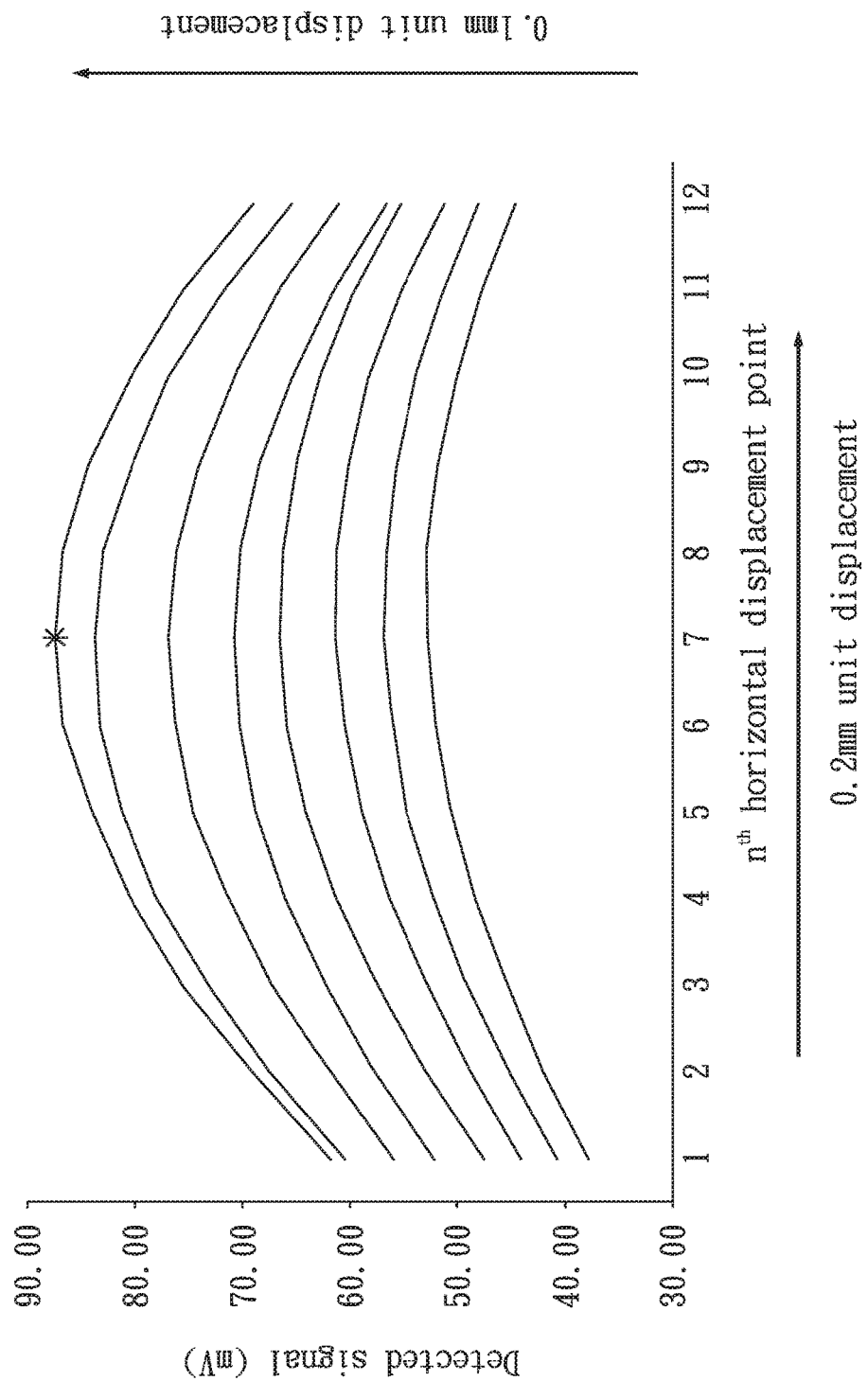
FIG. 6 shown the measured values of the current I to be detected at various displacement locations.
Figure 7:
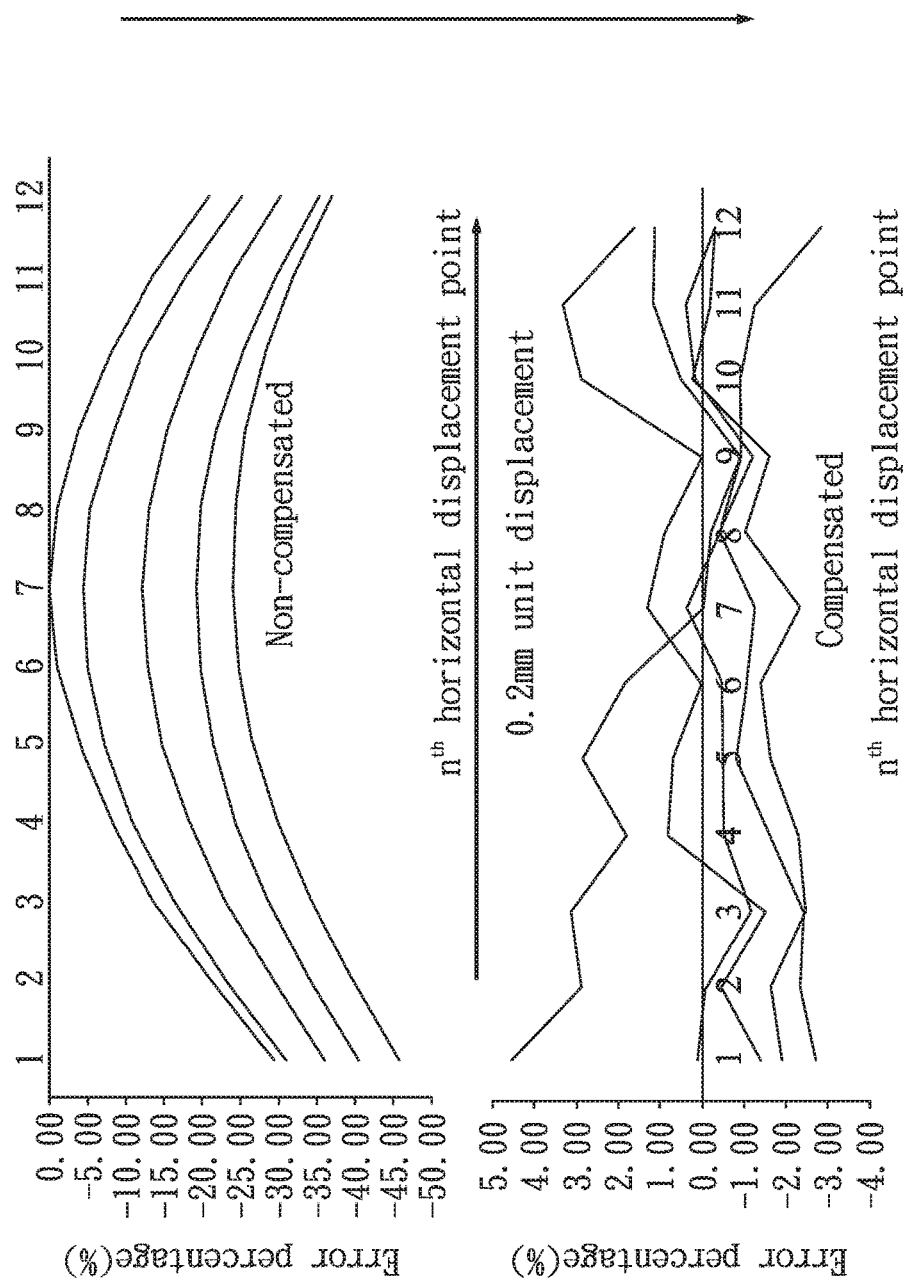
FIG. 7 shows the comparison between with and without compensation calculations in percentage errors.
Figure 8:
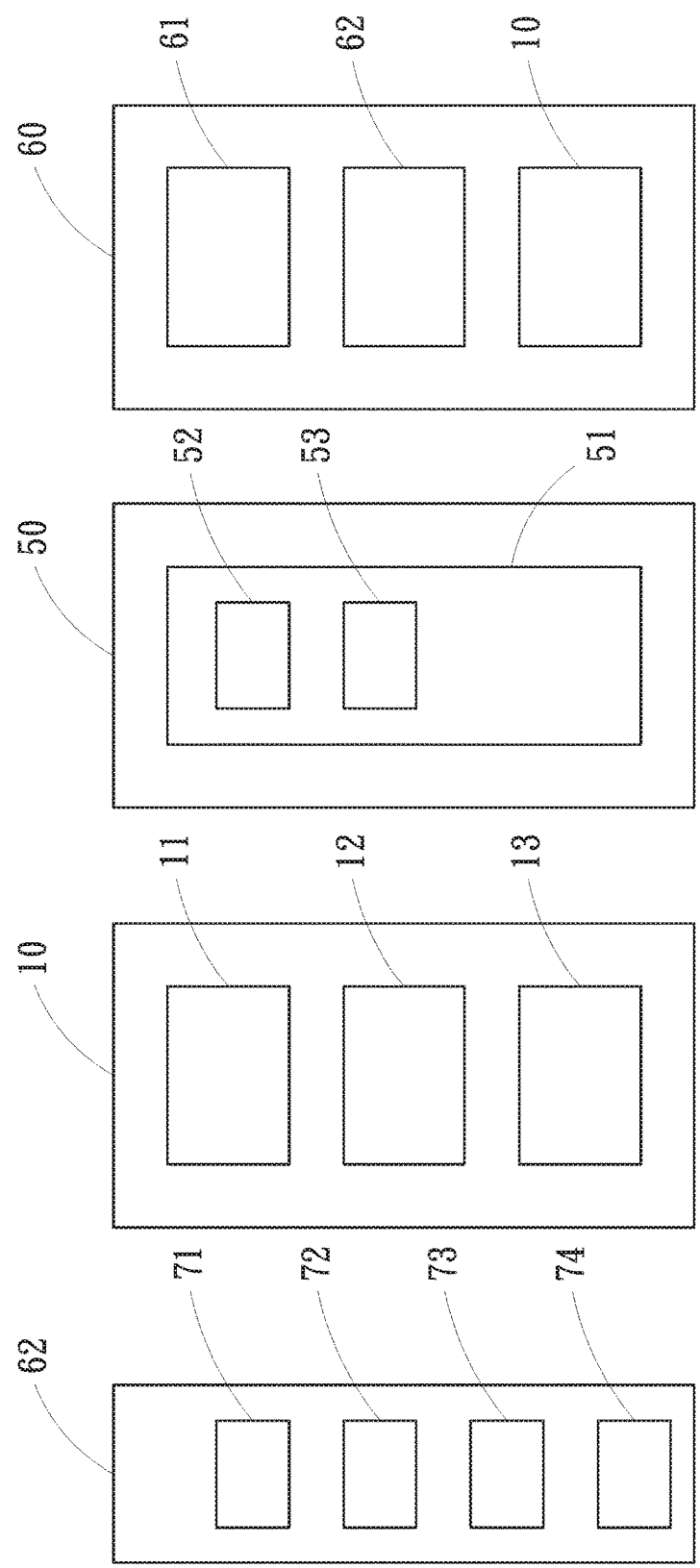
FIG. 8 shows an arrangement of the non-contact current sensors, the sensing element characteristic measuring unit, and the non-contact current measurement module.

The sensing element characteristic measuring unit 50 as shown in FIG. 8 is to establish the space characteristic measuring database 51 and includes a plurality of horizontal displacement indicators 52 and a plurality of vertical displacement indicators 53. As shown in FIG. 4 and FIG. 5, each of the horizontal displacement indicators 52 is a normalized characteristic measuring data referred by a pair of the horizontal displacement W and the third voltage $V_3$ and each of the vertical displacement indicators 53 is a respective characteristic measuring data referred by a pair of the first voltage $V_1$/the second voltage $$V_2 = \left[\frac{V_1}{V_2}\right]$$

and the $$\text{gain} = \left[\frac{I}{V_1}\right],$$

in which I is the electric current in the two-wire power cable 41. In the detection, the sensing element characteristic measuring unit 50 drives the non-contact current sensor 10 located at an upper position of the two-wire power cable 41 to move continuously in a 2D manner along the horizontal direction and the vertical direction. According to the Faraday's lay of induction, the current I would be induced in the two-wire power cable 41 and output the induced voltages (including the first voltage $V_1$, the second voltage $V_2$ and the third voltage $V_3$) through the first current sensor 11 the second current sensor 12 and the third current sensor 13 to establish the 2D space characteristic measuring database 51.

The non-contact current measurement module 60 as shown in FIG. 8 includes a measurement counting unit 61, a compensation algorithms calculating unit 62 and the non-contact current sensor 10, in which the non-contact current sensor 10 is located at a top (or say an upper) position above the two-wire power cable 41. According to the Faraday's law of induction, an electric current I would be induced in the two-wire power cable 41, and the first voltage $V_1$, the second voltage $V_2$ and the third voltage $V_3$ would be captured by the non-contact current sensor 10 and further be output to the compensation algorithms calculating unit 62. Then, through the measurement counting unit 61, the measured value of the current I of the two-wire power cable 41 can be detected and output.

The compensation algorithms calculating unit 62 as shown in FIG. 8 includes a first unit 71 featured by a first function $f_1$ as listed in the following. The first function $f_1$ is a function to locate the first distance $g_1$ from the 2D variable $$\left(\frac{V_1}{V_2}, W\right)$$

supplied from the 2D space characteristic measuring database, in which the first voltage $V_1$ is the voltage difference measured between the input end and the output end of the first current sensor 11, and the second voltage $V_2$ is the voltage difference measured between the input end and the output end of the second current sensor 12.

$$g_1 = f_1\left(\frac{V_1}{V_2}, W\right) \ldots \text{the first function } f_1$$

Namely, with various given horizontal displacements W, and after the first voltage $V_1$ and the second voltage $V_2$ are detected, then the value $$\frac{V_1}{V_2}$$

can be known, and then the corresponding first distances $g_1$ can be calculated through the first function $f_1$ in the first unit 71.

The compensation algorithms calculating unit 62 as shown in FIG. 8 further includes a second unit 72 featured by a second function $f_2$ as listed in the following.

The second function $f_2$ is a function to locate the gain $$\frac{I}{V_1}$$

(or say a calibration factor) from the 2D variable $$\left(\frac{V_1}{V_2}, W\right)$$

W) supplied from the 2D space characteristic measuring database, in which the first voltage $V_1$ is the voltage difference measured between the input end and the output end of the first current sensor 11, and the second voltage $V_2$ is the voltage difference measured between the input end and the output end of the second current sensor 12.

$$\frac{I}{V_1} = \text{gain} = f_2\left(\frac{V_1}{V_2}, W\right) \ldots \text{second function } f_2$$

In applying the second function $f_2$ as the first voltage $V_1$ and the second voltage $V_2$ are detected, then the second unit 72 can provide corresponding currents I to be detected of the two-wire power cable 41 with various given horizontal displacements W, through the second function $f_2$.

The compensation algorithms calculating unit 62 as shown in FIG. 8 further includes a third unit 73 featured by a third function $f_3$ as listed in the following. The third unit 73 is to utilize the data from the 2D space characteristic measuring database to establish a mathematical relationship between the horizontal displacement W and the third voltage $V_3$ so as to locate the horizontal displacement W through the variable pair of the first distance $g_1$ and $$\frac{V_3}{I}.$$

$$W = f_3\left(g_1, \frac{V_3}{I}\right) \ldots \text{the third function } f_3$$

Obviously, the third function $f_3$ has the two control variables, the first distance $g_1$ and the ratio $$\frac{V_3}{I}.$$

The voltage difference measured between the input end and the output end of the third current sensor 13 is defined as the third voltage $V_3$, which is the respective voltage change accounting to the horizontal displacement W. By given the first distance $g_1$, the horizontal displacement W and the ratio $$\frac{V_3}{I}$$

are related via the third function $f_3$. The current I to be detected is calculated in the second unit 72 and is further plugged into the third function $f_3$ of the third unit 73 so as to locate a value for the horizontal displacement W.

In the fourth unit 74, the calculation begins at setting up the initial conditions, in which, typically, the initial conditions include the first distance $g_1$=0, the current I to be detected=5 A, and the horizontal displacement W=0 mm. Then, perform the coupling computations in order through the first unit 71, the second unit 72, and the third unit 73, till the current I to be detected is convergent while $$\frac{I_n - I_{n-1}}{I_n} < 0.01,$$

or while the executing number n is over 20. In any of the situations, a new round of the coupling computations shall be performed after re-setting the initial conditions.

In this disclosure, the sensing element characteristic measuring unit is to establish a 2D sensor characteristic curve surface for building in the space characteristic measuring database. The method to achieve such a purpose is to move a standard electric current source on a 2D movable platform so as to formulate a detection-feasible arrangement for the 2D sensors, and then the signals can be captured to be further furnished to the sensing element characteristic measuring unit for constructing the aforesaid curve surface. Further, the compensation algorithms calculating unit utilizes the space characteristic measuring database to energize the calculations through the space characteristic functions $f_1$, $f_2$ and $f^3$, and also the first voltage $V_1$, the second voltage $V_2$ and the third voltage $V_3$ can get involved in the calculations in the measurement counting unit so as to output a measured value of the current I in the two-wire power cable.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. An apparatus for compensating installation position variation of a non-contact current sensor on a two-wire power cable, comprising:
   a non-contact current sensor, having a first current sensor, a second current sensor, and a third current sensor, the non-contact current sensor being mounted at a top position of a two-wire power cable, a horizontal direction being defined as a direction collinear with a connection line of two centers of corresponding two wires of the two-wire power cable, a vertical direction being defined as a direction perpendicular to the horizontal direction, wherein the first current sensor, located in the vertical direction upper to the two-wire power cable; the second current sensor, located in the vertical direction upper to the first current sensor; the third current sensor is formed by integrating serially two independent coils located in the horizontal direction but oppositely and symmetrically with respect to a center line of the non-contact current sensor;
   a sensing element characteristic measuring unit for constructing a space characteristic measuring database for the non-contact current sensor respective to the two-wire power cable, wherein the characteristic measuring database includes a 2D sensor characteristic curve formed by collected signals obtained by moving a 2D sensor structure composed of the first current sensor, the second current sensor and the third sensor via a 2D movable platform; and
   a non-contact current measurement module for pairing the space characteristic measuring database so as to compute and further output a measured value of the current I in the two-wire power cable;
   wherein the space characteristic measuring database further includes:
   a plurality of horizontal displacement indicators, each of the horizontal displacement indicators being a normalized characteristic measuring data set defined by a pair of a horizontal displacement W and the third voltage $V_3$; and
   a plurality of vertical displacement indicators, each of the vertical displacement indicators being a respective characteristic measuring data set defined by a pair of the first voltage $V_1$/the second voltage $$V_2 = \left[\frac{V_1}{V_2}\right]$$

and a $$\text{gain} = \left[\frac{I}{V_1}\right],$$

wherein the I is the electric current in the two-wire power cable.

2. The apparatus for compensating installation position variation of a non-contact current sensor on a two-wire power cable according to claim 1, wherein the first current sensor is spaced to the two-wire power cable by a first distance $g_1$; the second current sensor is spaced to the first current sensor by a second distance $g_2$; and a third voltage $V_3$ is defined as a voltage difference between an input end of the third current sensor and an output end thereof;
   wherein the first current sensor and the second current sensor are both coil-type sensors, a first voltage $V_1$ is defined as a voltage difference between an input end of the first current sensor and an output end thereof, and a second voltage $V_2$ is defined as a voltage difference between an input end of the second current sensor and an output end thereof.

3. The apparatus for compensating installation position variation of a non-contact current sensor on a two-wire power cable according to claim 2,
   wherein the sensing element characteristic measuring unit drives the non-contact current sensor located at an upper position of the two-wire power cable to move continuously in a 2D manner along the horizontal direction and the vertical direction, and, according to the Faraday's lay of induction, the current I induced in the two-wire power cable outputs the induced voltages (including the first voltage $V_1$, the second voltage $V_2$ and the third voltage $V_3$) through the first current sensor, the second current sensor and the third current sensor to establish the 2D space characteristic measuring database.

4. The apparatus for compensating installation position variation of a non-contact current sensor on a two-wire power cable according to claim 3, wherein the non-contact current measurement module further includes:
- a measurement counting unit;
- a compensation algorithms calculating unit; and
- the non-contact current sensor;
- wherein the non-contact current sensor is located at an upper position above the two-wire power cable, an electric current I is induced in the two-wire power cable according to the Faraday's law of induction, and the first voltage $V_1$, the second voltage $V_2$ and the third voltage $V_3$ are captured by the non-contact current sensor so as further to be output to the compensation algorithms calculating unit and further to output a measured value of the current I of the two-wire power cable through the measurement counting unit.

5. The apparatus for compensating installation position variation of a non-contact current sensor on a two-wire power cable according to claim 4, wherein the compensation algorithms calculating unit further includes:
- a first unit, featured by a first function $f_1$ as a function to locate the first distance $g_1$ from a 2D variable $$\left(\frac{V_1}{V_2}, W\right)$$

supplied from the 2D space characteristic measuring database, i.e.

$$g_1 = f_1\left(\frac{V_1}{V_2}, W\right) \ldots \text{the first function } f_1,$$

wherein, with various given horizontal displacements W and after the first voltage $V_1$ and the second voltage $V_2$ are detected, the value $$\frac{V_1}{V_2}$$

is known, and then the corresponding first distances $g_1$ are calculated through the first function $f_1$ in the first unit;
- a second unit, featured by n second function $f_2$ as a function to locate a gain $$\frac{I}{V_1}$$

from the 2D variable $$\left(\frac{V_1}{V_2}, W\right)$$

supplied from the 2D space characteristic measuring database, i.e.

$$\frac{I}{V_1} = \text{gain} = f_2\left(\frac{V_1}{V_2}, W\right) \ldots \text{second function } f_2;$$

wherein, as the first voltage $V_1$ and the second voltage $V_2$ are detected, the second unit provides corresponding currents I to be detected of the two-wire power cable with various given horizontal displacements W;
- a third unit, featured by a third function $f_3$ to utilize data supplied from the 2D space characteristic measuring database to establish a mathematical relationship between the horizontal displacement W and the third voltage $V_3$ so as to locate the horizontal displacement W through a variable pair of the first distance $g_1$ and $$\frac{V_3}{I},$$

i.e.

$$W = f_3\left(g_1, \frac{V_3}{I}\right) \ldots \text{the third function } f_3,$$

wherein, by given the first distance $g_1$, the current I to be detected calculated in the second unit is further plugged into the third function $f_3$ of the third unit so as to locate a value for the horizontal displacement W; and
- a fourth unit for setting up initial conditions for coupling computations, wherein the initial conditions include the first distance $g_1=0$, the current I to be detected=5 A, and the horizontal displacement W=0 mm, wherein the coupling computations are performed in order through the first unit, the second unit, and the third unit till the current I to be detected is convergent while $$\frac{I_n - I_{n-1}}{I_n}$$

<0.01, or while the executing number n is over 20 (computation-end situations); wherein, in any of the computation-end situations, a new round of the coupling computations is performed after re-setting the initial conditions.

* * * * *